(12) United States Patent
Tiwari et al.

(10) Patent No.: US 10,296,682 B2
(45) Date of Patent: May 21, 2019

(54) SYSTEM AND METHOD FOR EXTRACTING RELEVANT COMPUTATIONAL DATA FOR DESIGN ANALYSIS AND VALIDATION (71) Applicant: AIRBUS ENGINEERING CENTRE INDIA, Bangalore (IN)

(72) Inventors: Punit Tiwari, Bangalore (IN); Shreesh Mishra, Bangalore (IN)

(73) Assignee: AIRBUS GROUP INDIA PRIVATE LIMITED, Bangalore, Karnataka (IN)

( * ) Notice: Subject to any disclaimer, the term of this patent is extended or adjusted under 35 U.S.C. 154(b) by 1136 days.

(21) Appl. No.: 14/166,907

(22) Filed: Jan. 29, 2014

(65) Prior Publication Data
US 2014/0222389 A1 Aug. 7, 2014

(30) Foreign Application Priority Data

Feb. 7, 2013 (IN) .............................. 520/CHE/2013

(51) Int. Cl.
*G06F 17/50* (2006.01)
*G06F 17/10* (2006.01)
*B29C 47/08* (2006.01)
*B81C 99/00* (2010.01)

(52) U.S. Cl.
CPC .......... *G06F 17/5018* (2013.01); *G06F 17/10* (2013.01); *G06F 17/5009* (2013.01); *B29C 47/0854* (2013.01); *B81C 99/006* (2013.01)

(58) Field of Classification Search
None
See application file for complete search history.

(56) References Cited

U.S. PATENT DOCUMENTS

| 5,522,019 A | * | 5/1996 | Bala ........................ G06T 17/20 345/419 |
| 2005/0056409 A1 | * | 3/2005 | Foli .......................... F28F 7/02 165/164 |
| 2009/0300038 A1 | * | 12/2009 | Chen ..................... G06F 16/283 |

(Continued)

OTHER PUBLICATIONS

Scalars, Vectors and Tensors, pp. 1-12, 2006.*

*Primary Examiner* — Kibrom K Gebresilassie
(74) *Attorney, Agent, or Firm* — Prakash Nama; Global IP Services, PLLC (57) ABSTRACT

A system and method for extracting relevant computational data are disclosed. In one embodiment, one or more physical quantities and/or one or more functions of physical quantities of interest, associated with a larger volume, to be measured are identified. Further, any non-available identified functions of physical quantities are computed for each smaller volume of the larger volume using the available physical quantities in the computational data. Furthermore, regions in computational domain are identified along with ranges of identified physical quantities and functions of physical quantities of interest for carrying out the extraction from the computational data. Moreover, geometrical and connectivity information of smaller volumes associated with the identified regions/ranges that are obtained by filtering the computational data associated with the larger volume are obtained. Also, one or more clusters of smaller volumes are obtained using the obtained geometrical and connectivity information of smaller volumes associated with the identified regions/ranges.

24 Claims, 5 Drawing Sheets (56) References Cited

U.S. PATENT DOCUMENTS

| | | | | |
|---|---|---|---|---|
| 2010/0121621 A1* | 5/2010 | Uenishi | ............... | G06F 17/5095 703/2 |
| 2010/0204963 A1* | 8/2010 | Shapiro | ............... | G06F 17/5018 703/1 |
| 2011/0098987 A1* | 4/2011 | Isoshima | ............ | G06F 17/5018 703/1 |
| 2011/0224951 A1* | 9/2011 | Kim | .................... | G06F 17/5018 703/1 |
| 2012/0166148 A1* | 6/2012 | Yoshida | .................... | B64C 3/14 703/1 |
| 2012/0215498 A1* | 8/2012 | Hallquist | ............ | G06F 17/5018 703/1 |
| 2014/0222384 A1* | 8/2014 | Nordmark | ........... | G06F 17/5018 703/1 |
| 2015/0339432 A1* | 11/2015 | Nance | ................ | G06F 17/5072 716/106 |
| 2016/0239597 A1* | 8/2016 | Shimizu | ............... | G06F 17/5018 |
| 2016/0283624 A1* | 9/2016 | Sakamaki | .......... | G01N 23/2251 |
| 2018/0253524 A1* | 9/2018 | El Sayed | ............ | G06F 17/5036 |
| 2018/0267075 A1* | 9/2018 | Machida | ................ | B81C 99/001 |
| 2018/0273378 A1* | 9/2018 | Kawamura | ............... | B81C 1/00 |
| 2018/0357358 A1* | 12/2018 | Milstead | ............ | G06F 17/5095 |

\* cited by examiner

SYSTEM AND METHOD FOR EXTRACTING RELEVANT COMPUTATIONAL DATA FOR DESIGN ANALYSIS AND VALIDATION

RELATED APPLICATIONS

Benefit is claimed under 35 U.S.C 119(a)-(d) to Indian Application Serial No. 520/CHE/2011 entitled "SYSTEM AND METHOD FOR EXTRACTING RELEVANT COMPUTATIONAL DATA FOR DESIGN ANALYSIS AND VALIDATION" filed on Feb. 7, 2013 by Airbus Engineering Centre India.

FIELD OF TECHNOLOGY

Embodiments of the present subject matter generally relate to computational data, and more particularly, to extracting relevant computational data for engineering/design analysis and validation.

BACKGROUND

One of the difficult aspects of any engineering/design analysis during various design and validation phases in a product cycle is extracting needed data for better understanding the behavior of a device and/or a system. This is especially true with computational data, such as computational fluid dynamics (CFD) data and finite element analysis (FEA) data and so on, that are based on discretization of overall geometry/domain into large number of smaller volumes (called as cells/elements). Such computational data can amount to few millions to hundreds of millions of physical quantities/data (for example, pressure, velocity and temperature data) associated with each smaller volume of the larger volume or an enclosure and it can be seen that this can amount to significantly large amount of computational data. Extracting most relevant data and needed information from such large amount of computational data can be expensive and time consuming.

Generally, only such extracted data is relevant for carrying out the experiments and analysis. Typically, such relevant data is obtained based on heuristic approach, such as historical information or prior experimental information and such data may not be accurate. For example, the relevant data can be used to determine the locations, where the measurements have to be made in an avionics air conditioning system's bay to obtain more meaningful results and gain a better understanding, for carrying out future experimental thermal validations and for analyzing the computational data.

SUMMARY

A system and method for extracting relevant computational data for design analysis and validation are disclosed. According to one aspect of the present subject matter, one or more of physical quantities and/or one or more of functions of physical quantities of interest, associated with a larger volume, to be measured are identified. Further, any non-available identified one or more functions of physical quantities are computed for each smaller volume of the larger volume using the available one or more physical quantities in the computational data. Furthermore, regions in computational domain are identified along with ranges of identified one or more physical quantities and one or more functions of physical quantities of interest for carrying out the extraction from the computational data. Moreover, geometrical and connectivity information of smaller volumes associated with the identified regions/ranges that are obtained by filtering the computational data associated with the larger volume are obtained.

In addition, one or more clusters/chunks of smaller volumes are obtained using the obtained geometrical and connectivity information of smaller volumes associated with the identified regions/ranges. Also, a volume associated with each of the obtained one or more clusters/chunks are computed. Moreover, one or more relevant clusters/chunks that are significant based on a user defined critical volume are determined.

According to another aspect of the present subject matter, the system for extracting relevant computational data for design analysis and validation includes a processor and a memory coupled to the processor. Further, the memory includes a computational data extraction tool. In one embodiment, the computational data extraction tool includes instructions to perform the method described above.

According to another aspect of the present subject matter, a non-transitory computer-readable storage medium for extracting relevant computational data for design analysis and validation having instructions that, when executed by a computing device, cause the computing device to perform the method described above.

The systems and methods disclosed herein may be implemented in any means for achieving various aspects. Other features will be apparent from the accompanying drawings and from the detailed description that follow.

BRIEF DESCRIPTION OF THE DRAWINGS

Various embodiments are described herein with reference to the drawings, wherein.

The drawings described herein are for illustration purposes only and are not intended to limit the scope of the present disclosure in any way.

DETAILED DESCRIPTION

A system and method for extracting relevant computational data for design analysis and validation are disclosed.

In the following detailed description of the embodiments of the present subject matter, references are made to the accompanying drawings that form a part hereof, and in which are shown by way of illustration specific embodiments in which the present subject matter may be practiced. These embodiments are described in sufficient detail to enable those skilled in the art to practice the present subject matter, and it is to be understood that other embodiments may be utilized and that changes may be made without departing from the scope of the present subject matter. The following detailed description is, therefore not to be taken in a limiting sense, and the scope of the present subject matter is defined by the appended claims.

The terms "cells", "elements" and "smaller volumes" of a larger volume of an enclosure/device/system are used interchangeably throughout the document. These interchangeable terms refer to a smallest volumetric unit (or surface unit in 2-D) of discretized model of the larger volume. Further, the terms "clusters" and "chunks" of an enclosure are used interchangeably throughout the document. Furthermore, the term "node" refers to a corner of a cell. Two adjacent nodes connect to form an edge of a cell. Three or more adjacent edges connect to form a face and four or more faces connect to form a cell in 3-D model. In a 2-D model, one edge forms a face and three or more faces form a cell. In addition, the terms "cluster" or "chunk" refer to a group of connected elements, where two elements are defined as "connected" if they share a common node, an edge, a face or another element. Also, the terms "model", "system" and "device" are used interchangeably throughout the document.

Figure 1:
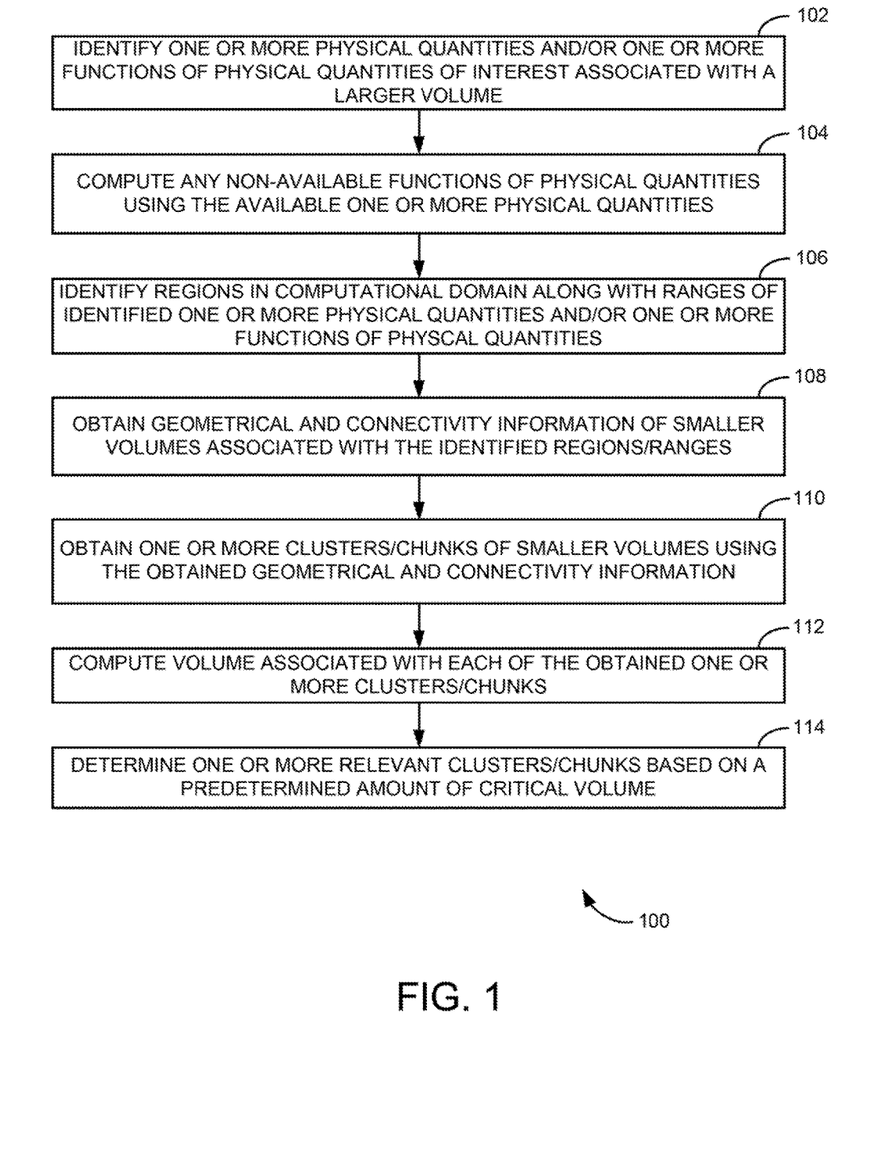
FIG. 1 illustrates a flowchart of a method for extracting relevant computational data, according to an embodiment of the invention.

FIG. 1 illustrates a flowchart 100 of a method for extracting relevant computational data, according to an embodiment of the invention. At block 102, one or more physical quantities and/or one or more functions of physical quantities of interest, associated with a larger volume, to be measured are identified. Exemplary physical quantities include temperature, pressure, velocity and electromagnetic quantities and the like. For example, the physical quantities include a scalar quantity, a vector quantity, a tensor quantity and the like. Exemplary functions of physical quantities include derivatives of the physical quantities, such as stress, turbulence parameter, acceleration and the like. For example, acceleration is a derivative of the physical quantity velocity.

At block 104, any non-available identified one or more functions of physical quantities are computed for each smaller volume of the larger volume using the available one or more physical quantities in the computational data. Exemplary computational data includes volume and discretized data, such as computational fluid dynamics (CFD) data, finite element analysis (FEA) data, electromagnetic data, acoustic data and the like.

At block 106, regions in a computational domain are identified along with ranges of identified one or more physical quantities and one or more functions of physical quantities of interest for extracting relevant data from the computational data. The identified data, which includes ranges of identified one or more physical quantities and one or more functions of physical quantities, extracted from the computational data is significantly smaller in size as compared to the computational data.

At block 108, geometrical and connectivity information of smaller volumes associated with the identified regions/ranges that are obtained by filtering the computational data associated with the larger volume are obtained. Exemplary geometrical information of smaller volumes includes nodes and coordinates of smaller volumes and the like. Exemplary connectivity information of the smaller volumes includes node, edge, and face connectivity information of the smaller volumes.

At block 110, one or more clusters/chunks of smaller volumes are obtained using the geometrical and connectivity information of the smaller volumes associated with the identified regions/ranges. The one or more clusters/chunks are obtained such that each of the smaller volumes within each cluster/chunk are connected with each other and not connected with smaller volumes of a different cluster/chunk. For example, two smaller volumes are connected when they share a common node, an edge or a face. This is explained in more detail with reference to FIG. 2.

At block 112, a volume associated with each of the obtained one or more clusters/chunks is computed. This is explained in more detail with reference to FIGS. 2 and 3. At block 114, one or more relevant clusters/chunks that are significant based on a user defined critical volume are determined. The one or more relevant clusters of smaller volumes are obtained using the user defined critical volume information and the obtained geometrical and connectivity information of smaller volumes associated with the identified regions/ranges. This is explained in more detail with reference to FIGS. 2 and 4.

Figure 2:
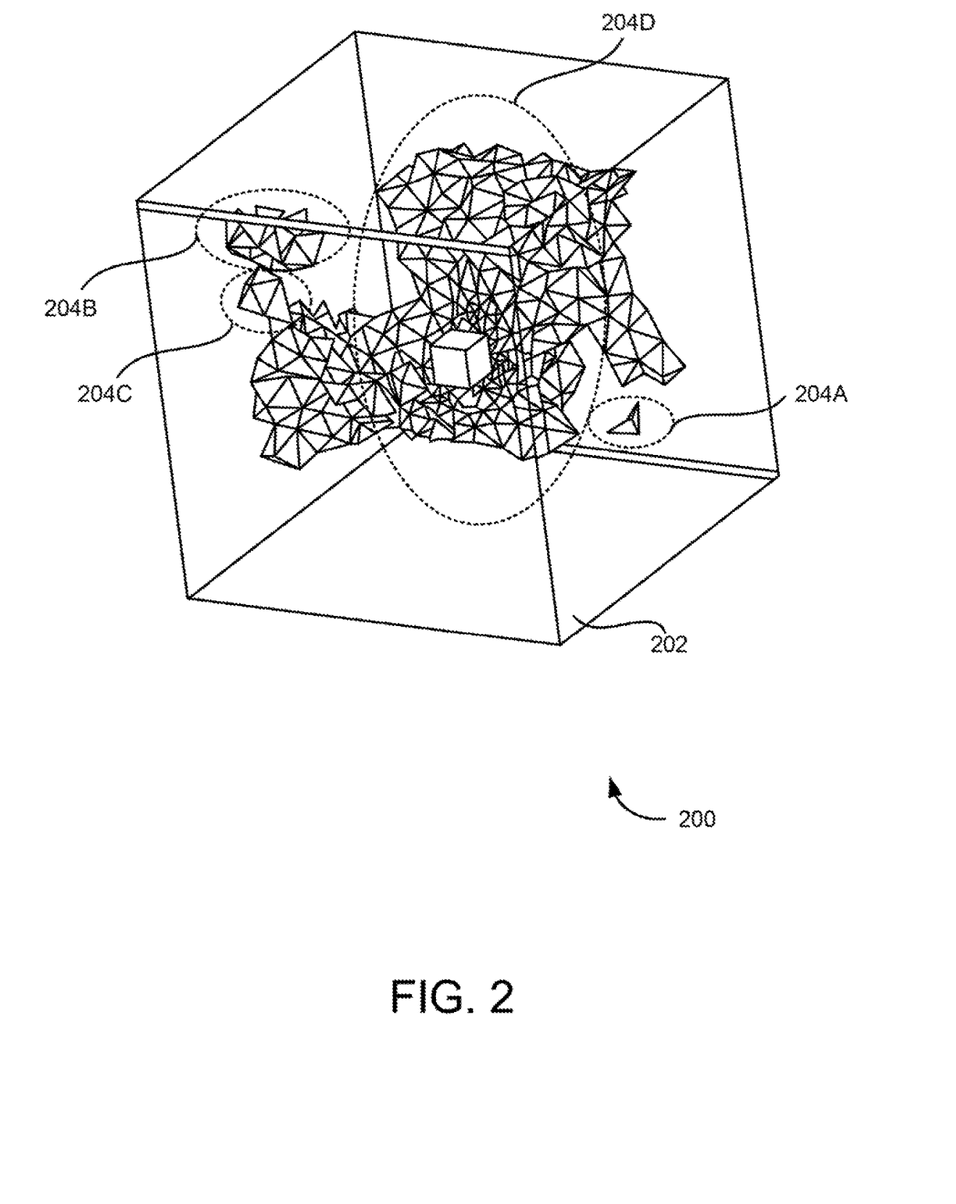
FIG. 2 is a screenshot showing a connectivity regeneration diagram obtained using the method, such as the one shown with reference to FIG. 1, according to an embodiment of the invention.

Referring now to FIG. 2, which is a screenshot 200 showing a connectivity regeneration diagram obtained using the method, such as the one shown in FIG. 1, according to an embodiment of the invention. Particularly, FIG. 2 shows a larger volume 202 of a system/enclosure for which computational data associated with various physical quantities are computed. As shown in FIG. 2, the larger volume 202 includes many smaller volumes/cells. For example, the cells are tetrahedral cells.

In one embodiment, one or more physical quantities and/or one or more functions of physical quantities of interest, associated with the larger volume 202, to be measured are identified. Exemplary physical quantities include temperature, pressure, velocity and electromagnetic quantities and the like. Exemplary functions of physical quantities include derivatives of the physical quantities, such as stress, turbulence parameter, acceleration and the like. Further, any non-available identified one or more functions of physical quantities are computed for each smaller volume of the larger volume 202 using the available one or more physical quantities in the computational data. For example, computational data includes volume and discretized data, such as CFD data, FEA data, electromagnetic data, acoustic data and the like.

Furthermore, regions in computational domain are identified along with ranges of the identified one or more physical quantities and one or more functions of physical quantities of interest for carrying out the extraction from the computational data. In addition, geometrical and connectivity information of smaller volumes associated with the identified regions/ranges that are obtained by filtering the computational data associated with the larger volume are obtained. For example, the geometrical and connectivity information of the smaller volumes are obtained from the computational data associated with the larger volume 202. Exemplary geometrical information of smaller volumes includes information, such as nodes and coordinates of smaller volumes. Exemplary connectivity information of smaller volumes includes information, such as node, edge, and face connectivity information of smaller volumes.

Moreover, one or more clusters/chunks 204A-D of smaller volumes are obtained using the obtained geometrical and connectivity information of smaller volumes associated with the identified regions/ranges. In this embodiment, the one or more clusters/chunks 204A-D are obtained such that each of the smaller volumes within each cluster/chunk are connected with each other and not connected with smaller volumes of a different cluster/chunk. For example, two smaller volumes are connected when they share a common node, an edge, a face or another smaller volume. Further, after each chunk is obtained, the smaller volumes in the obtained chunk are excluded from computation while obtaining the next chunk. This reduces the cost of computation significantly.

Further in this embodiment, a volume associated with each of the obtained one or more clusters/chunks 204A-D is computed. Furthermore, one or more relevant clusters/chunks that are significant based on a user defined critical volume are determined. For example, in FIG. 2, cluster/chunk 204D is considered significant based on the user defined critical volume.

Figure 3:
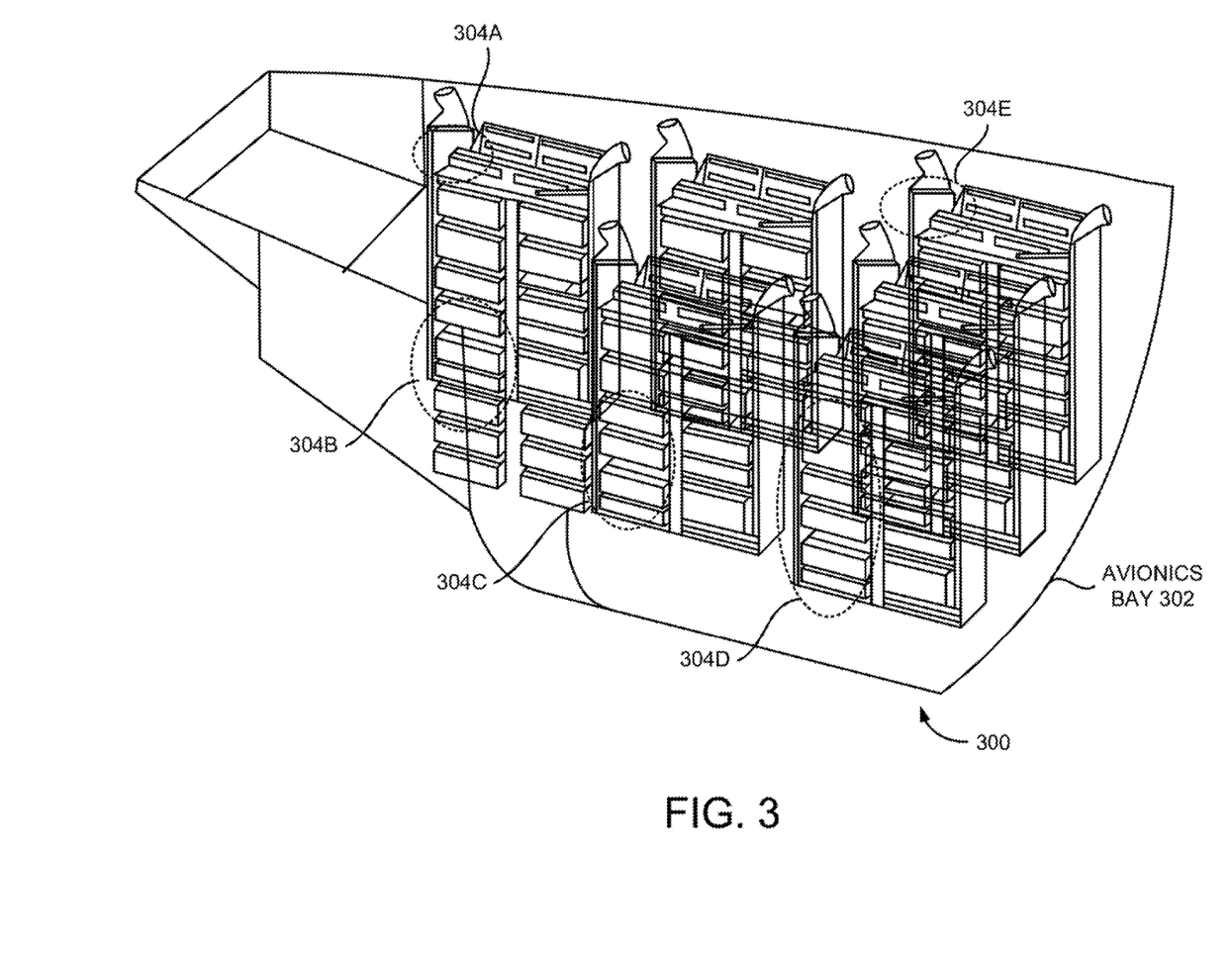
FIG. 3 is a schematic showing a connectivity regeneration diagram of regions of low temperature gradient for an avionics bay including relevant chunks/clusters obtained from a computational fluid dynamics (CFD) simulation data using the method, such as the one shown with reference to FIG. 1, according to an embodiment of the invention.

Referring now to FIG. 3, which is a schematic 300 showing a connectivity regeneration diagram of regions of low temperature gradient for an avionics bay 302 including chunks/clusters 304A-E obtained from a CFD simulation data using the method, such as the one shown in FIG. 1, according to an embodiment of the invention. The avionics bay 302 is an exemplary simulation volume used to describe the method, such as the one shown in FIG. 1. The low temperature gradient is an exemplary physical quantity which is identified to be measured in the avionics bay 302. Particularly, FIG. 3 illustrates regions in the avionics bay 302 with low temperature gradient.

In one embodiment, regions in the avionics bay 302 along with a range of low temperature gradient are identified for carrying out the extraction of the relevant computational data. Further, geometrical and connectivity information of smaller volumes associated with the identified regions/ranges that are obtained by filtering the computational data associated with the avionics bay 302 are obtained. For example, the geometrical and connectivity information of the smaller volumes are obtained from the computational data associated with the avionics bay 302 (which is the larger volume in this embodiment). Furthermore, one or more clusters/chunks 304A-E of smaller volumes are obtained using the obtained geometrical and connectivity information of smaller volumes associated with the identified regions/ranges. In addition, a volume associated with each of the obtained one or more clusters/chunks 304A-E is computed. Also, one or more relevant clusters/chunks that are significant based on a user defined critical volume are determined. This is explained in detail with reference to FIG. 4.

Figure 4:
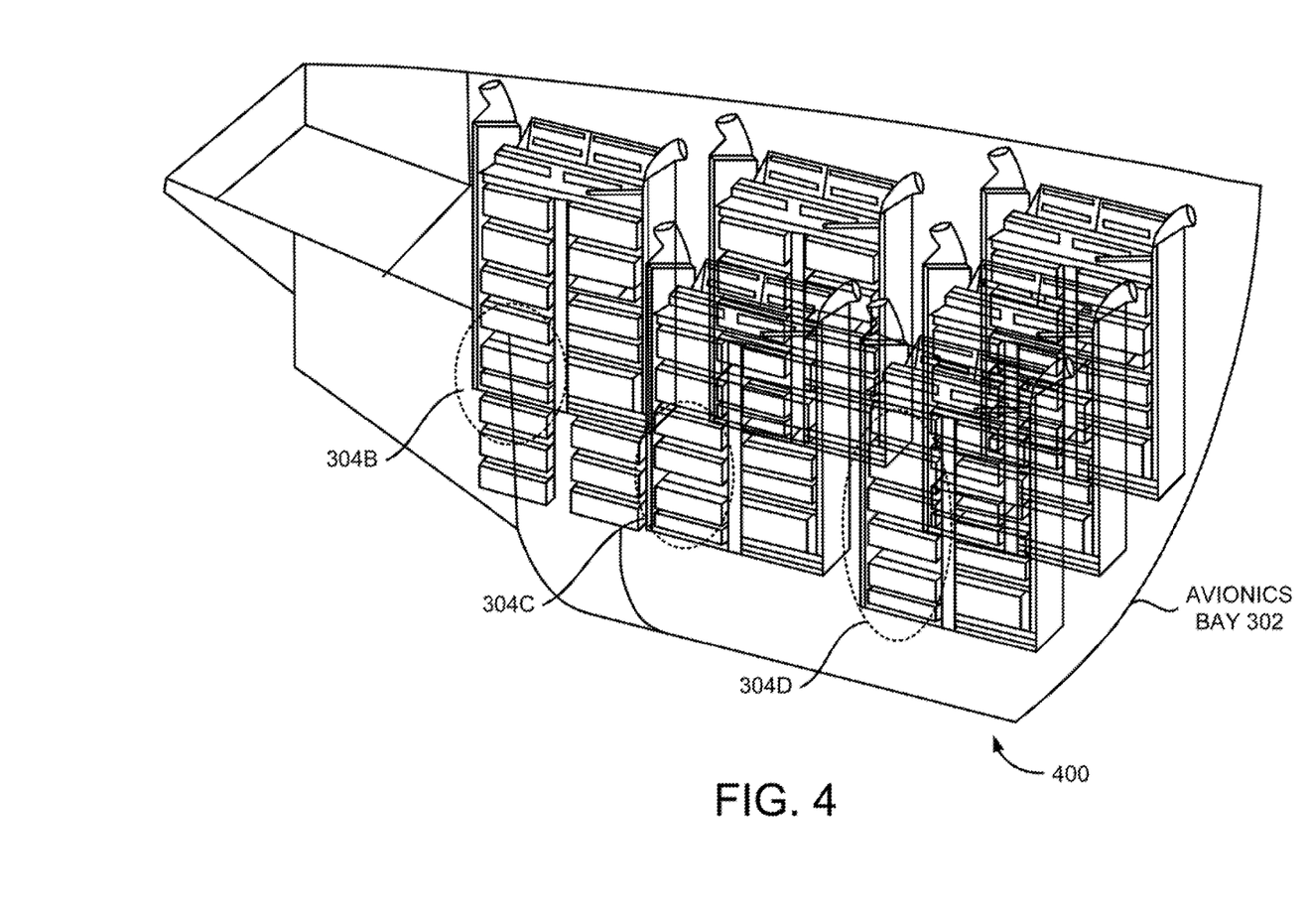
FIG. 4 is a schematic showing a connectivity regeneration diagram of regions of low temperature gradient for an avionics bay including significant relevant chunks/clusters obtained from a CFD simulation data using the method, such as the one shown with reference to FIG. 1, after applying a pre-determined critical volume criterion, according to an embodiment of the invention.

Referring now to FIG. 4, which is a schematic 400 showing a connectivity regeneration diagram of regions of low temperature gradient for the avionics bay 302 including significant relevant chunks/clusters 304B-D obtained from a CFD simulation data using the method, such as the one shown in FIG. 1, after applying a pre-determined critical volume criterion, according to an embodiment of the invention. The avionics bay 302 is an exemplary simulation volume used to describe the method, such as the one shown in FIG. 1. The low temperature gradient is an exemplary physical quantity which is identified to be measured in the avionics bay 302. As shown, relevant chunks/clusters 304B-D are determined as significant based on the user defined critical volume. In one embodiment, the relevant clusters/chunks 304B-D of smaller volumes are determined using the user defined critical volume information and the obtained geometrical and connectivity information of smaller volumes associated with the identified regions/ranges.

Figure 5:
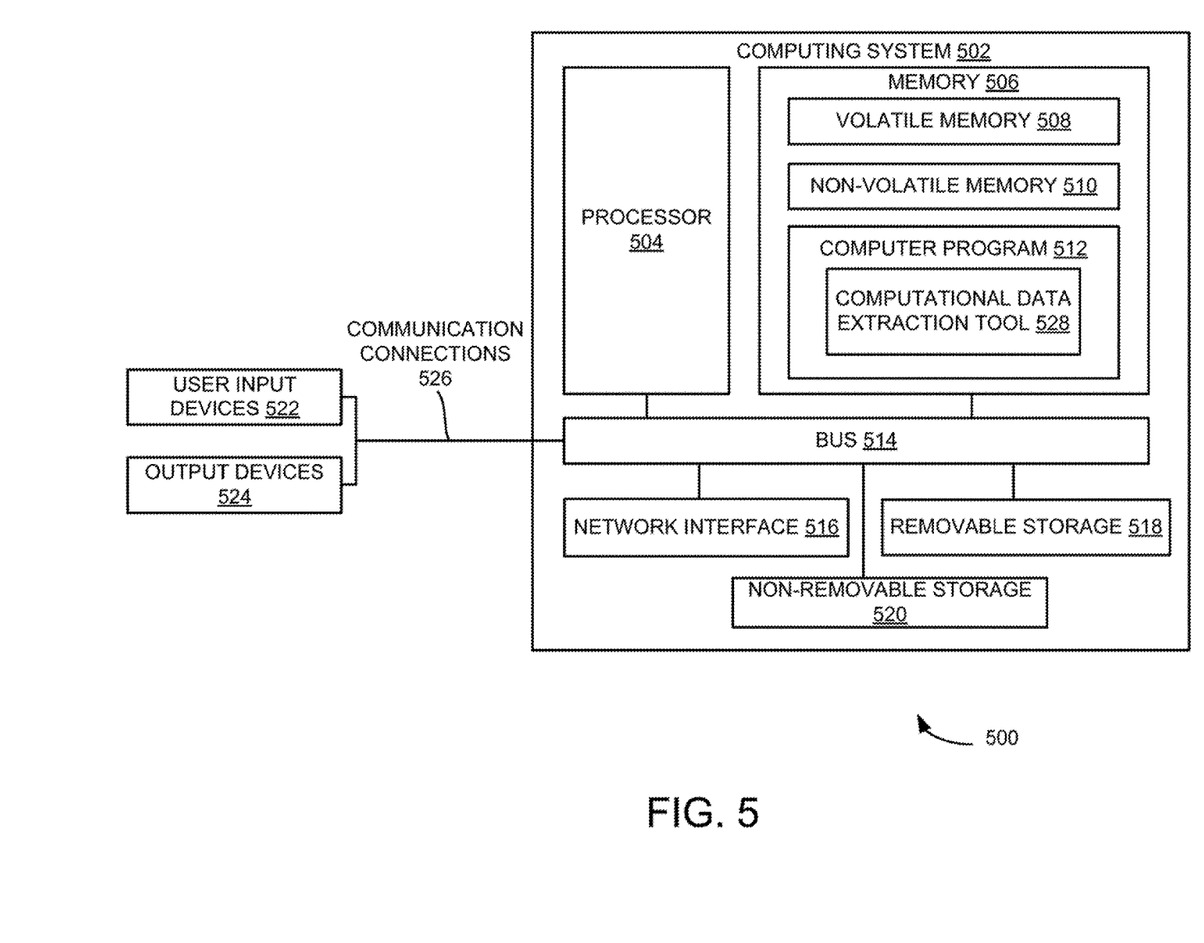
FIG. 5 illustrates the computing system including a computational data extraction tool for extracting relevant computational data for design analysis and validation using the method shown with reference to FIG. 1, according to an embodiment of the invention.

Referring now to FIG. 5, which illustrates a computing system 502 including a computational data extraction tool 528 for extracting relevant computational data for design analysis and validation using the process shown in FIG. 1, according to an embodiment of the invention. FIG. 5 and the following discussions are intended to provide a brief, general description of a suitable computing environment in which certain embodiments of the inventive concepts contained herein are implemented.

The computing system 502 includes a processor 504, memory 506, a removable storage 518, and a non-removable storage 520. The computing system 502 additionally includes a bus 514 and a network interface 516. As shown in. FIG. 5, the computing system 502 includes access to the computing system environment 500 that includes one or more user input devices 522, one or more output devices 524, and one or more communication connections 526 such as a network interface card and/or a universal serial bus connection.

Exemplary user input devices 522 include a digitizer screen, a stylus, a trackball, a keyboard, a keypad, a mouse and the like. Exemplary output devices 524 include a display unit of the personal computer, a mobile device and the like. Exemplary communication connections 526 include a local area network, a wide area network, and/or other network.

The memory 506 further includes volatile memory 508 and non-volatile memory 510. A variety of computer-readable storage media are stored in and accessed from the memory elements of the computing system 502, such as the volatile memory 508 and the non-volatile memory 510, the removable storage 518 and the non-removable storage 520. The memory elements include any suitable memory device (s) for storing data and machine-readable instructions, such as read only memory, random access memory, erasable programmable read only memory, electrically erasable programmable read only memory, hard drive, removable media drive for handling compact disks, digital video disks, diskettes, magnetic tape cartridges, memory cards, Memory Sticks™, and the like.

The processor 504, as used herein, means any type of computational circuit, such as, but not limited to, a microprocessor, a microcontroller, a complex instruction set computing microprocessor, a reduced instruction set computing microprocessor, a very long instruction word microprocessor, an explicitly parallel instruction computing microprocessor, a graphics processor, a digital signal processor, or any other type of processing circuit. The processor 504 also includes embedded controllers, such as generic or programmable logic devices or arrays, application specific integrated circuits, single-chip computers, smart cards, and the like.

Embodiments of the present subject matter may be implemented in conjunction with program modules, including functions, procedures, data structures, and application programs, for performing tasks, or defining abstract data types or low-level hardware contexts. Machine-readable instructions stored on any of the above-mentioned storage media may be executable by the processor 504 of the computing system 502. For example, a computer program 512 includes machine-readable instructions capable of extracting relevant computational data for design analysis and validation in the computing system 502, according to the teachings and herein described embodiments of the present subject matter. In one embodiment, the computer program 512 is included on a compact disk-read only memory (CD-ROM) and loaded from the CD-ROM to a hard drive in the non-volatile memory 510. The machine-readable instructions cause the computing system 502 to encode according to the various embodiments of the present subject matter.

As shown, the computer program 512 includes the computational data extraction tool 528. For example, the computational data extraction tool 528 can be in the form of instructions stored on a non-transitory computer-readable storage medium. The non-transitory computer-readable storage medium having the instructions that, when executed by the computing system 502, causes the computing system 502 to perform the one or more methods described in FIGS. 1 through 4.

In various embodiments, the methods and systems described in FIGS. 1 through 5 enable extracting relevant volumetric (3D (3-dimensional) systems/devices/models) data and/or surface computational (2D (2-dimensional) systems/devices/models) data for design analysis and validation thereby reducing the size of CFD data. Further, the methods and systems described in FIGS. 1 to 5 refer to extracting relevant computational data associated with ventilation, electromagnetic, acoustic, structural and the like. Furthermore, the above described method can be used to identify the probe locations for experimental validations and reduce the number of iterations in placing the probes at required locations. Thus, saving cost in terms of man hours and experiments. In addition, the method is useful to users for different activities or analysis, such as design iterations based on preliminary CFD results, experimental setup and validation of CFD results, safety analysis for propagation of smoke or combustion particles, identification of regions with high/low humidity values or any other species concentration, ventilation requirements of hot equipments/structural materials to avoid burnout/failure and so on.

Although, the above-mentioned embodiments are described with respect to a CFD experimental analysis, one can envision using the above described idea in FEA, electromagnetic structural and acoustic analysis and the like. It can also be envisioned that this idea can be used wherever a discretized volumetric or surfacic computational data is available. In addition, it will be appreciated that the various operations, processes, and methods disclosed herein may be embodied in a machine-readable medium and/or a machine accessible medium compatible with a data processing system (e.g., a computer system), and may be performed in any order (e.g., including using means for achieving the various operations). Accordingly, the specification and drawings are to be regarded in an illustrative rather than a restrictive sense.

What is claimed is:

1. A method of extracting computational data for design analysis and validation of a structure, comprising:
   identifying one or more physical quantities and one or more functions of physical quantities of interest, associated with a larger volume, to be measured;
   identifying regions that are defined in computational domain by filtering computational data associated with the larger volume, wherein the identified regions include ranges of identified one or more physical quantities and one or more functions of physical quantities of interest for carrying out the extraction from the computational data;
   obtaining geometrical and connectivity information of smaller volumes, of the larger volume, associated with the identified regions that are obtained by filtering the computational data associated with the larger volume;
   obtaining clusters of smaller volumes using the obtained geometrical and connectivity information of smaller volumes associated with the identified regions;
   determining one or more clusters that are significant based on a user defined critical volume from the clusters of smaller volumes;
   extracting the computational data associated with the one or more clusters that are significant to reduce a size of the computational data associated with the larger volume for performing the design analysis and validation, and to determine probe locations where measurements are to be made in the structure;
   performing, by a computing system, the design analysis and validation of the structure using the extracted computational data associated with the one or more clusters that are significant and the probe locations; and
   designing the structure according to an outcome of the design analysis and validation.

2. The method of claim 1, wherein determining the one or more clusters that are significant based on a user defined critical volume from the clusters of smaller volumes, comprises:
   computing a volume associated with each of the obtained clusters; and
   determining the one or more clusters that are significant from the clusters based on the user defined critical volume.

3. The method of claim 1, wherein the physical quantity is selected from the group consisting of temperature, pressure, velocity and electromagnetic quantities.

4. The method of claim 1, wherein the physical quantity is a scalar quantity, a vector quantity, or a tensor quantity.

5. The method of claim 1, wherein the functions of the physical quantities comprise derivatives of the physical quantities.

6. The method of claim 1, wherein the computational data comprises volume and discretized data that is selected from the group consisting of computational fluid dynamics (CFD) data, finite element analysis (FEA) data, electromagnetic data and acoustic data.

7. The method of claim 1, wherein the geometrical information of smaller volumes comprises information selected from the group consisting of nodes and coordinates of the smaller volumes.

8. The method of claim 1, wherein the connectivity information of smaller volumes comprises information selected from the group consisting of node, edge, and face connectivity information of the smaller volumes.

9. The method of claim 1, wherein obtaining the clusters comprise:
   obtaining the clusters such that each of the smaller volumes within each cluster are connected with each other and not connected with smaller volumes of a different cluster, wherein two smaller volumes are connected when they share a common node, an edge or a face or another smaller volume.

10. The method of claim 2, wherein determining the one or more clusters that are significant based on the User defined critical volume comprise:
    determining the one or more clusters of smaller volume elements that are significant using the user defined critical, volume information and the obtained geometrical and connectivity information of smaller volumes associated with the identified regions.

11. A computing system, comprising:
    a processor;

memory coupled to the processor, wherein the memory includes a computational data extraction tool having instructions to:
  identify one or more physical quantities and one or more functions of physical quantities of interest, associated with a larger volume, to be measured;
  identify regions that are defined in computational domain by filtering computational data associated with the larger volume, wherein the identified regions include ranges of identified one or more physical quantities and one or more functions of physical quantities of interest fur carrying out the extraction from the computational data;
  obtain geometrical and connectivity information of smaller volumes, of the larger volume, associated with the identified regions that are obtained by filtering the computational data associated with the larger volume;
  obtain clusters of smaller volumes using the obtained geometrical and connectivity information of smaller volumes associated with the identified regions;
  determine one or more clusters that are significant based on a user defined critical volume from the clusters of smaller volumes;
  extract the computational data that are associated with the one or more clusters that are significant to reduce a size of the computational data associated with the larger volume for performing the design analysis and validation, and to determine probe locations where measurements are to be made in the structure; and
  perform design analysis and validation on a structure by applying the extracted computational data associated with the one or more clusters that are significant and the probe locations, wherein the structure is designed according to an outcome of the design analysis and validation.

12. The computing system of claim 11, wherein the computational data extraction tool determines the one or more clusters that are significant based on a user defined critical volume from the dusters of smaller volumes, by:
  computing a volume associated with each of the obtained clusters; and
  determining the one or more clusters that are significant from the clusters based on the user defined critical volume.

13. The computing system of claim 11, wherein the physical quantity is selected from the group consisting of temperature, pressure, velocity and electromagnetic quantities.

14. The computing system of claim 11, wherein the physical quantity is a scalar quantity, a vector quantity, or a tensor quantity.

15. The computing system of claim 11, wherein the functions of the physical quantities comprise derivatives of the physical quantities.

16. The computing system of claim 11, wherein the computational data comprises volume and discretized data that is selected from the group consisting of computational fluid dynamics (CFD) data, finite element analysis (FEA) data, electromagnetic data and acoustic data.

17. The computing system of claim 11, wherein the geometrical information of smaller volumes comprises information selected from the group consisting of nodes and coordinates of the smaller volumes.

18. The computing system of claim 11, wherein the connectivity information of smaller volumes comprises information selected from the group consisting of node, edge, and face connectivity information of the smaller volumes.

19. The computing system of claim 11, the computational data extraction tool further having instructions to:
  obtaining the clusters such that each of the smaller volumes within each cluster/chunk are connected with each other and not connected with smaller volumes of a different cluster/chunk, wherein two smaller volumes are connected when they share a common node, an edge or a face or another smaller volume.

20. The computing system of claim 12, the computational data extraction tool further having instructions to:
  determining the one or more clusters of smaller volume elements using the user defined critical volume information and the obtained geometrical and connectivity information of smaller volumes associated with the identified regions.

21. A non-transitory computer-readable storage medium for extracting computational data having instructions that, when executed by a computing device, cause the computing device to:
  identify one or more physical quantities and one or more functions of physical quantities of interest, associated with a larger volume, to be measured;
  identify regions that are defined in computational domain by filtering computational data associated with the larger volume, wherein the identified regions include ranges of identified one or more physical quantities and one or more functions of physical quantities of interest for carrying out the extraction from the computational data;
  obtain geometrical and connectivity information of smaller volumes, of the larger volume, associated with the identified regions that are obtained by filtering the computational data associated with the larger volume;
  obtain clusters of smaller volumes using the obtained geometrical and connectivity information of smaller volumes associated with the identified regions;
  determine one or more clusters that are significant based on a user defined critical volume from the clusters of smaller volumes;
  extract the computational data that are associated with the one or more clusters that are significant to reduce a size of the computational data associated with the larger volume for
  performing the design analysis and validation, and to determine probe locations where measurements are to be made in the structure;
  perform design analysis and validation of the structure using the extracted computational data associated with the one or more clusters that are significant and the probe locations; and
  design the structure according to an outcome of the desi in analysis and validation.

22. The non-transitory computer-readable storage medium of claim 21, wherein determining the one or more clusters that are significant based on a user defined critical volume from the clusters of smaller volumes comprises:
  computing a volume associated with each of the obtained clusters; and
  determining the one or more clusters that are significant from the clusters based on the user defined critical volume.

23. The non-transitory computer-readable storage medium of claim 21, wherein obtaining the clusters comprise:

obtaining the clusters such that each of the smaller volumes within each cluster/chunk are connected with each other and not connected with smaller volumes of a different cluster/chunk, wherein two smaller volumes are connected when they share a common node, an edge or a face or another smaller volume.

24. The non-transitory computer-readable storage medium of claim 22, wherein determining the one or more clusters that are significant based on the user defined critical volume comprise:

determining the one or more clusters of smaller volume elements using the user defined critical volume information and the obtained geometrical and connectivity information of smaller volumes associated with the identified regions.

* * * * *